Sept. 6, 1966

JAMES E. WEBB
ADMINISTRATOR OF THE NATIONAL AERONAUTICS
AND SPACE ADMINISTRATION 3,271,637

GaAs SOLAR DETECTOR USING MANGANESE AS A DOPING AGENT

Filed July 22, 1963

INVENTOR.
EDWARD F. PASIERB by G D O'Brien
B C Kearney

United States Patent Office 3,271,637

Patented Sept. 6, 1966

3,271,637
GaAs SOLAR DETECTOR USING MANGANESE AS A DOPING AGENT

James E. Webb, Administrator of the National Aeronautics and Space Administration with respect to an invention of Edward F. Pasierb Filed July 22, 1963, Ser. No. 296,879
1 Claim. (Cl. 317—234)

This invention relates to the vapor deposition of gallium arsenide films to manganese substrates to provide semiconductor devices having a relatively small substrate resistance.

Various semiconductor devices have existed heretofore wherein gallium arsenide films are deposited upon substrates of germanium to provide p-n junctions, and the like. However, for certain applications, such as solar energy converters, it is desirable that a substantially lower substrate resistance be provided than that obtainable with germanium.

The present invention provides semiconductor devices of the general type noted above, but which have a low resistance substrate and are, accordingly, particularly advantageous in solar energy converter applications. More particularly, the present invention provides for the vapor deposition of thin polycrystalline films of gallium arsenide upon polycrystalline substrates of manganese to thereby provide semiconductor devices or portions thereof, which by virtue of the metallic properties of manganese, have a low substrate resistance. In one form of device in accordance with the invention, a p-type semiconductor to conductor junction is provided at the interface defined between the gallium arsenide film and manganese substrate. In another device embodiment which may be produced, the film of n-type gallium arsenide is deposited upon a film of p-type gallium arsenide which has been previously deposited upon the manganese substrate. A p-n junction is thereby provided between the respective films of p and n type gallium arsenide. In a further, and particularly salient device embodiment in accordance with the invention, a film of n-type gallium arsenide is vapor-deposited directly upon the manganese substrate and a slight amount of manganese diffusion into the gallium arsenide is effected at the gallium arsenide-manganese interface. Inasmuch as manganese is a p-type determining material in gallium arsenide, a p-n junction is thereby directly provided within the deposited gallium arsenide film.

A better understanding of the invention may be had from the following illustrative description and the accompanying drawing, wherein.

Figure 1:
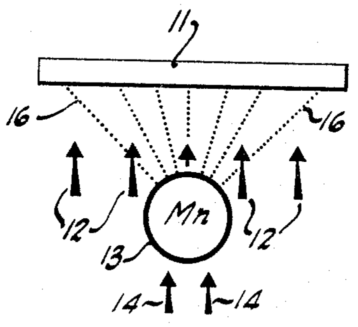
FIGURE 1 is a schematic illustration of an initial step of the method of producing semiconductor devices in accordance with the invention.

Broadly stated, the present invention comprises the provision of semiconductor devices which include a low electrical resistance substrate region of manganese and a deposited film region of gallium arsenide contiguous with the manganese to thereby provide an electrical junction at, or adjacent the interface defined by the substrate and film regions. The term "electrical junction" is used herein to mean a low resistance ohmic contact. More particularly, the invention provides a method of forming semiconductor devices of the foregoing variety which, by virtue of the properties of manganese, are particularly suited to solar energy converter applications and equivalent applications wherein a low resistance substrate is required. With reference to FIGURE 1, there is initially provided a backing member 11, which is preferably of a material such as molybdenum, and which may be heated, as indicated by the arrows 12, to a relatively high temperature. Manganese is then evaporated upon a face of the backing member 11, as by disposing a manganese source 13 subjacent the heated backing member and applying heat to such source, as indicated by the arrows 14, to convert the manganese into the vapor state. The manganese vapor rises, as indicated by the dashed lines 16, to be, in turn, deposited as a thin layer upon the subface of the backing member. This evaporated layer of manganese serves as a substrate 17 suitable for the deposition of gallium arsenide thereon in a manner subsequently described. It should be noted that the thickness of the evaporated manganese substrate 17 is very thin, preferably less than 1.0 micron, for purposes of reducing the potential problems of thermal stress and cracking from heating due to thermal expansion differences which may arise in subsequent stages of the process or in use of the resultant device.

Figure 2:
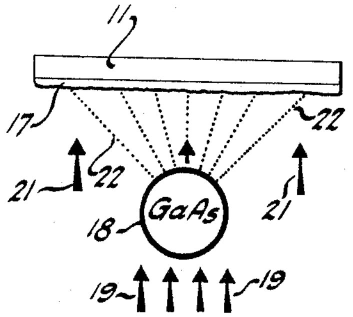
FIGURE 2 is a schematic illustration similar to FIGURE 1, showing a further step of the method.
Figure 3:
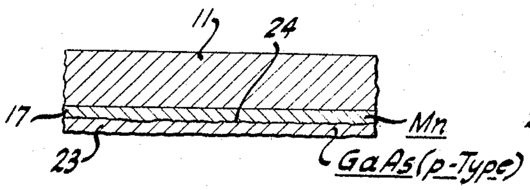
FIGURE 3 is a cross-sectional view of a semiconductor device produced by the method.

The unit comprising the backing member 11 and manganese substrate 17 evaporated thereon is next subjected to the vapor deposition of gallium arsenide, as by means of vapor transport techniques indicated in FIGURE 2. In this regard, the backing member 11 may be disposed with the manganese substrate 17 in close opposed relation to a gallium arsenide source wafer 18 and a suitable vapor transporting agent provided therebetween. The transport agent may be advantageously a stagnant reducing atmosphere, for example a substantially stagnant dry hydrogen atmosphere, which encompasses the backing member and source wafer 18. The source wafer and substrate are next heated, as respectively indicated by arrows 19 and 21, in such a manner that the source wafer is vaporized and is maintained at a slightly higher temperature than the substrate. By virtue of the temperature gradient and the transporting medium, gallium arsenide vapor is transported to the substrate, as indicated by the dashed lines 22, and is deposited as a thin film thereon. Through appropriate control of the temperature gradient between the source wafer 18 and substrate 17, and of the time during which the substrate is subjected to the vapor depositing process, the thickness of the gallium arsenide film may be readily controlled as desired. It has been found that gallium arsenide films vapor-deposited upon thin manganese substrates in the foregoing manner are substantailly uniform and continuous. In the instance of simple vapor deposition of the gallium arsenide on the manganese substrate, the manganese substrate and gallium arsenide film are both polycrystalline.

Where p-type gallium arsenide is employed as the wafer 18 in the conduct of the method described above, the manganese substrate 17 is, hence, coated with a thin film 23 of p-type gallium arsenide, as indicated in FIGURE 3. Inasmuch as manganese is a p-type determining material to gallium arsenide, the resulting semiconductor device of FIGURE 3 provides a p-type semiconductor to conductor ohmic contact at the interface 24 defined by the substrate 17 and film 23. This device is characterized by a low substrate resistance by virtue of the metallic properties of manganese.

Figure 4:
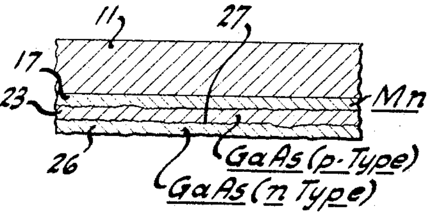
FIGURE 4 is a cross-sectional view of another semiconductor device embodiment which may be produced in accordance with the method.

P-n junction semiconductor devices having a low substrate resistance are also provided in accordance with the invention through a simple extension of the method described hereinbefore. More particularly, the basic structure of FIGURE 3, just described, is subjected to a further vapor deposition step of the type depicted by FIGURE 2. In this case the gallium arsenide source wafer 18 is of an opposite conductivity type from the first deposited layer. In the foregoing example, there is employed n-type gallium arsenide whereby the p-type gallium arsenide film 23 is coated with an n-type gallium arsenide film 26, and a modified semiconductor device of the type depicted in FIGURE 4 is obtained. Such device includes a p-n junction 27 which is defined between the p and n type gallium arsenide films 23 and 26, respectively.

Figure 5:
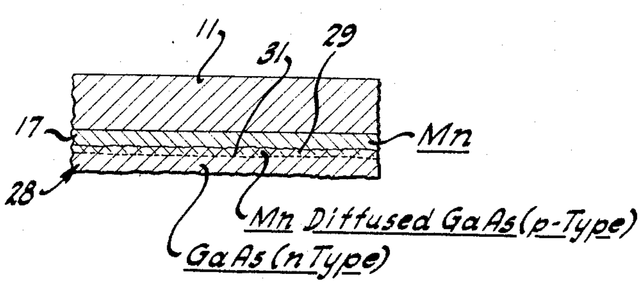
FIGURE 5 is a cross-sectional view of a further semiconductor device embodiment which may be produced in accordance with the method.

As a further particularly important alternative in the conduct of the method of the invention, n-type gallium arsenide may be employed as the source wafer 18 in the initial vapor deposition step of the method. As a result, a semiconductor device of the type depicted in FIGURE 5 is produced, wherein a thin film 28 of polycrystalline n-type gallium arsenide is vapor-deposited directly upon the manganese substrate 17. It is particularly important to note that during the deposition of the film 28 a slight amount of manganese diffusion into the n-type gallium arsenide film 28 is permitted. Such diffusion is accomplished by techniques well known in the art and is regulated, for example, by suitable control of the temperature of the substrate and deposited film. As a result, there is produced a manganese diffused gallium arsenide boundary layer 29 within the gallium arsenide film 28 adjacent the interface defined between the film and substrate. By virtue of the manganese being a p-type determining material, the diffusion layer 29 is converted to p-type gallium arsenide. A diffused p-n junction, as generally indicated at 31, is thus defined between the p and n type regions of the gallium arsenide film 28.

Although the present invention has been described hereinbefore and illustrated in the accompanying drawing with respect to specific steps of the method and several specific embodiments of articles producible by the method, it will be appreciated that various modifications and variations may be made therein without departing from the spirit and scope of the invention. For example, the backing member 11 of the various semiconductor device embodiments may be advantageously provided as a transparent material such as quartz to thereby provide back wall solar cells in which the light passes through the backing member to energize the electrical junction of the device. Thus, it is not intended to limit the invention except by the terms of the following claim.

What is claimed is:

A semiconductor device comprising: a molybdenum backing member; a manganese substrate dopant on said member, the dopant having a thickness of less than one micron; and a film of gallium arsenide on said substrate, the film and substrate providing an electrical p-type junction at the interface thereof.

References Cited by the Examiner

UNITED STATES PATENTS

| | | | |
|---|---|---|---|
| 2,937,324 | 5/1960 | Kroko | 317—234 |
| 3,005,107 | 10/1961 | Weinstein | 250—211 |
| 3,110,849 | 11/1963 | Soltys | 317—237 |
| 3,117,229 | 1/1964 | Friedland | 250—83.3 |
| 3,150,999 | 9/1964 | Rudenberg | 316—89 |
| 3,160,800 | 12/1964 | Smart | 317—235 |
| 3,179,541 | 4/1965 | Hull et al. | 148—175 |
| 3,179,542 | 4/1965 | Quinn et al. | 148—177 |
| 3,196,329 | 7/1965 | Cook et al. | 317—234 |
| 3,200,259 | 8/1965 | Braunstein | 307—88.5 |

FOREIGN PATENTS 887,208 1/1962 Great Britain.

JOHN W. HUCKERT, *Primary Examiner.*

JAMES D. KALLAM, M. EDLOW, *Assistant Examiners.*